United States Patent [19]
Tresness et al.

[11] Patent Number: 5,999,796
[45] Date of Patent: Dec. 7, 1999

[54] RETURN PATH ATTENUATION FILTER

[75] Inventors: Andrew F. Tresness, Manlius; Martin L. Zelenz, DeWitt, both of N.Y.

[73] Assignee: Tresness Irrevocable Patent Trust, Syracuse, N.Y.

[21] Appl. No.: 09/067,305

[22] Filed: Apr. 27, 1998

Related U.S. Application Data

[63] Continuation-in-part of application No. 08/818,231, Mar. 14, 1997, Pat. No. 5,745,838.

[51] Int. Cl.$^6$ .............................. H04N 7/14; H04H 1/00
[52] U.S. Cl. ................................ 455/5.1; 348/12
[58] Field of Search ............................ 455/3.1, 4.1, 4.2, 455/5.1, 6.1; 348/6, 7, 8, 12, 13; 359/124, 125, 154, 161; 370/297; 333/167, 175, 176; H04N 7/10, 7/14, 7/173

[56] References Cited

U.S. PATENT DOCUMENTS

| | | | |
|---|---|---|---|
| 4,397,037 | 8/1983 | Theriault ................................ | 455/188 |
| 4,963,966 | 10/1990 | Harney et al. ........................... | 358/349 |
| 5,130,664 | 7/1992 | Pavlic et al. ............................. | 330/55 |
| 5,379,141 | 1/1995 | Thompson et al. ...................... | 359/125 |
| 5,404,161 | 4/1995 | Douglass et al. ........................ | 348/1 |
| 5,425,027 | 6/1995 | Baran ..................................... | 370/69.1 |
| 5,434,610 | 7/1995 | Loveless ................................. | 348/6 |
| 5,481,389 | 1/1996 | Pidgeon et al. .......................... | 359/161 |

OTHER PUBLICATIONS

Wideband High–Selectivity Diplexers Utilizing Digital Elliptic Filters, Robert J. Wenzel, I EEE Transactions on Microwave Theory and Techniques, vol. Mtt–15, No. 12, Dec. 1967, (pp. 669–679).
Designing the Return System for Full Digital Services, Dean A. Stoneback and William F. Beck, 1995, (pp. 269–277).
Electronic Designers' Handbook, (p. 17).
Motion Picture Sound Engineering, Kimball, 1938, (pp. 258–259).
The Bell System Technical Journal,, 1969, (pp. 874–875).

Primary Examiner—John W. Miller
Attorney, Agent, or Firm—Trapani & Molldrem

[57] ABSTRACT

The present invention is a passive filter for controlling the return path loss in a communication system having a forward path and return path. The filter comprises first and second terminals, a passive filter network, and a compensation circuit. The passive filter network is coupled to the first and second terminals and to ground. The filter network has a first passband which passes signals in the forward path and a second passband which passes signals in the return path. The filter network includes a passive attenuator network which attenuates signals in the return path by a predetermined amount as the signals pass through the second passband. The compensation circuit is coupled to the passive filter network, and is configured to compensate for expected perturbations in the frequency response of the second passband of the filter network.

20 Claims, 9 Drawing Sheets

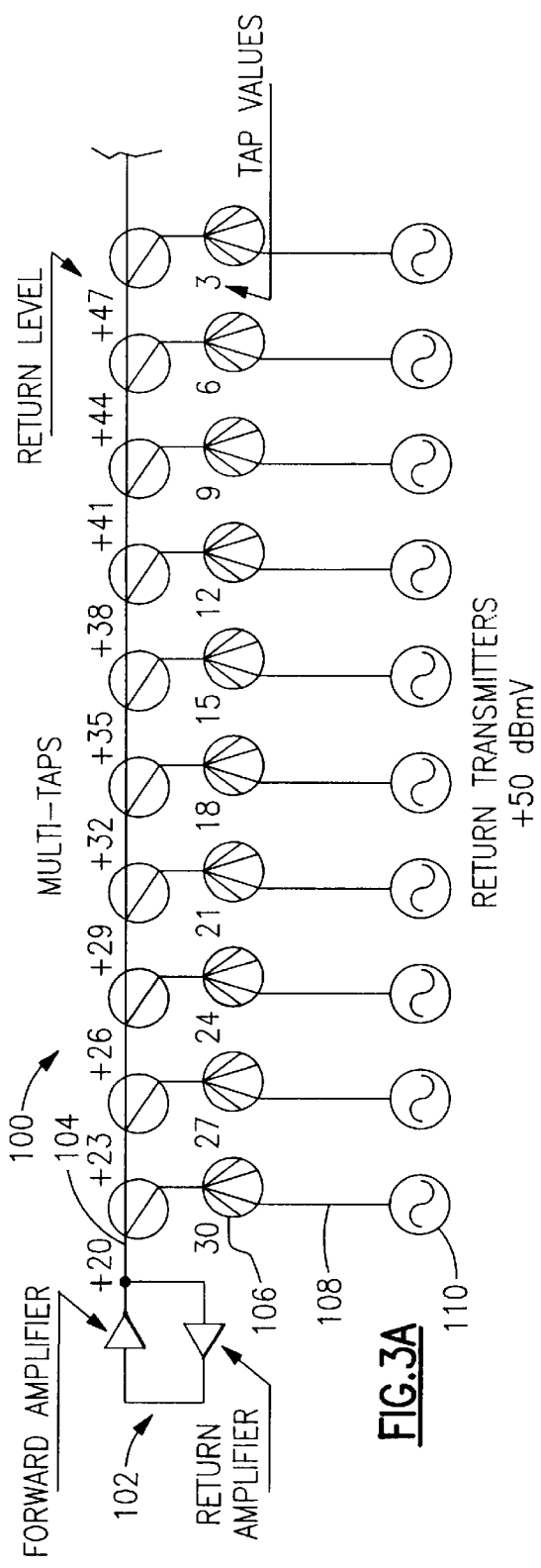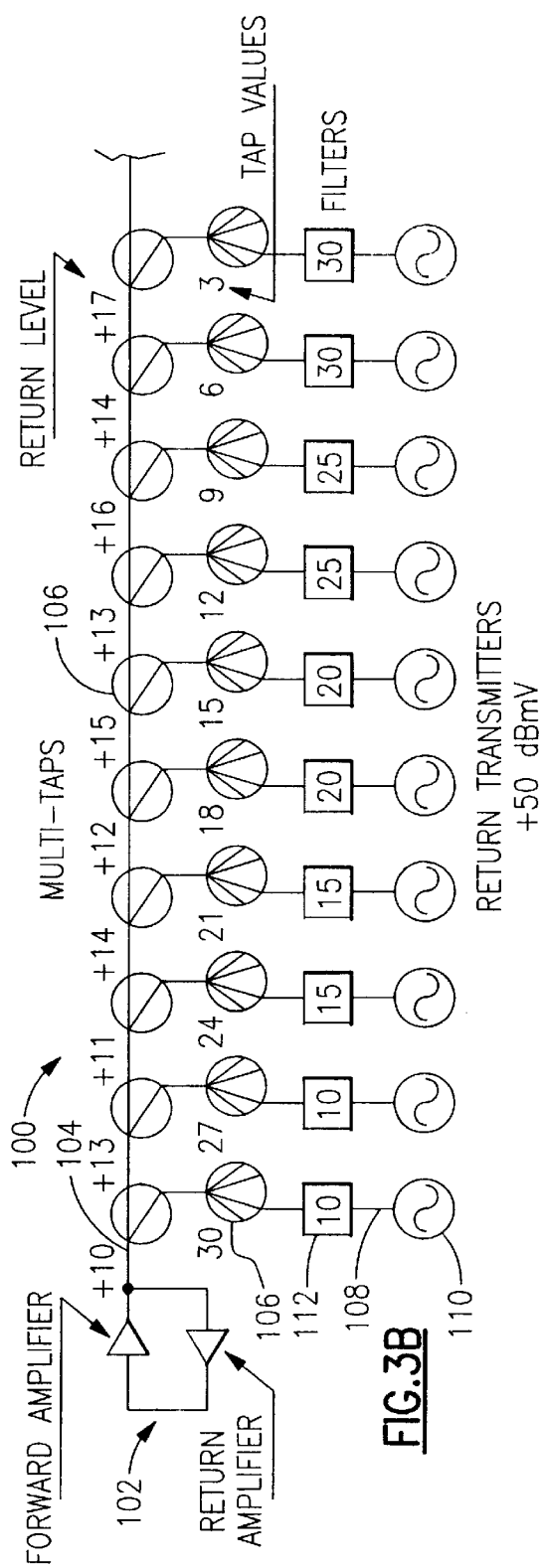
FIG.3A
FIG.3B

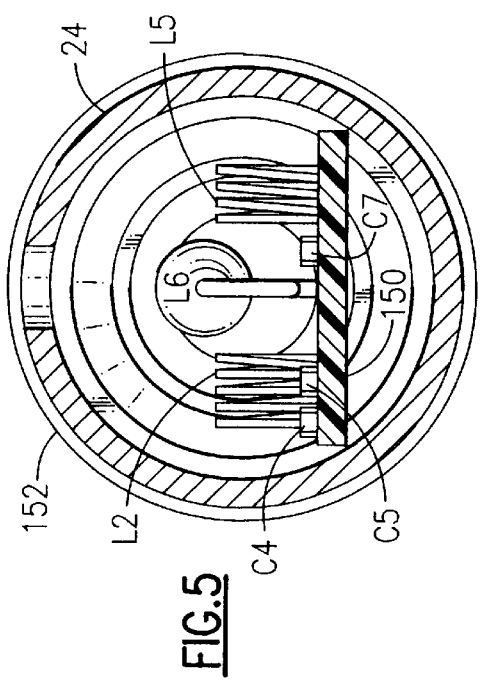
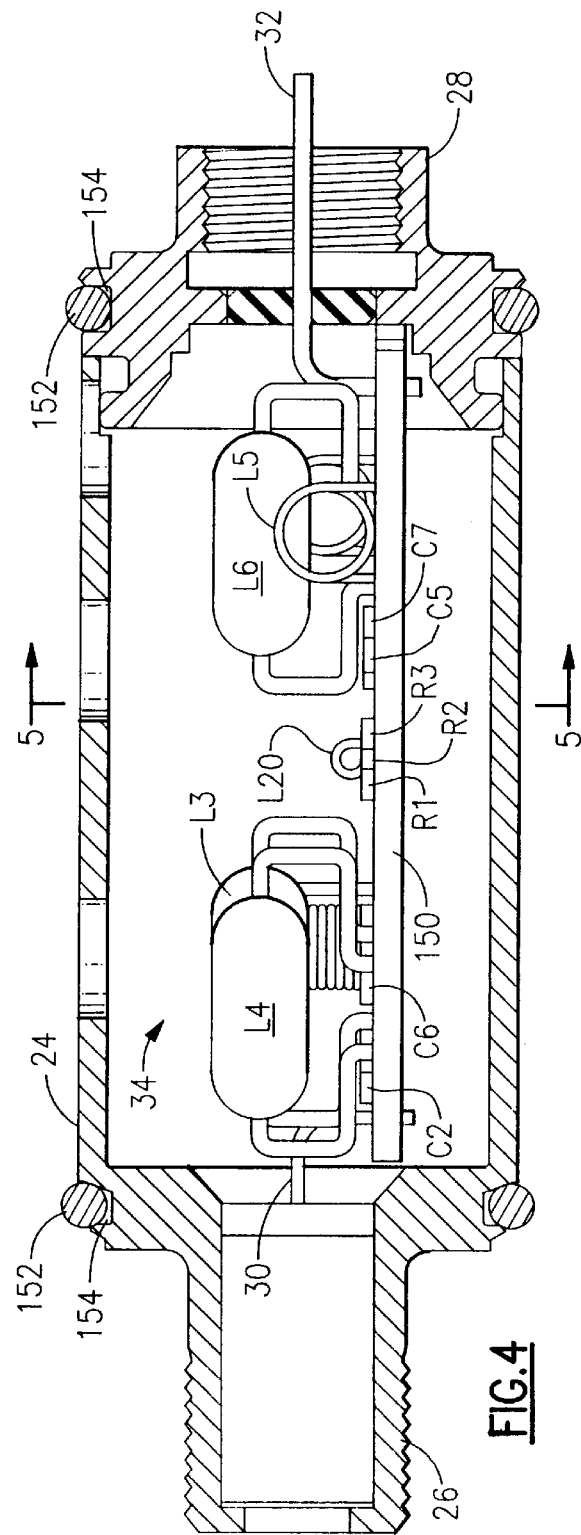

RETURN PATH ATTENUATION FILTER

CROSS-REFERENCES TO RELATED APPLICATIONS

This is a continuation-in-part of application Ser. No. 08/818,231, filed on Mar. 14, 1997, on which a patent will issue on Apr. 28, 1998, bearing U.S. Pat. No. 5,745,838.

BACKGROUND OF THE INVENTION

1. Technical Field

The present invention relates generally to a multi-band filter used in a multi-channel communication system, such as a two-way CATV cable system. The present invention relates more particularly to a multi-band filter providing a predetermined amount of attenuation in one of the bands of said filter.

2. Background Art

In some multi-channel communication systems, it is desirable to selectively control the loss at several points in at least one of the channels of the system. One example of such a system is a community antenna television (CATV) system, having a two-way communication capability. In such a system, RF television program signals are transmitted from a headend to a subscriber end over a particular frequency band. This band is referred to as the forward (or downstream) path (or channel) of the CATV system. Other signals are transmitted from the subscriber end to the headend, or to some other upstream station. These other signals are transmitted in a different frequency band (higher and/or lower) than the forward path frequency band, and this different band is usually referred to as the return (or upstream) path (or channel) of the CATV system.

Coupled between the headend and subscriber end of the CATV system, there is a system of coaxial and/or optical cables. A typical cable system architecture includes a main trunk cable connected between the headend and a trunk/bridger station. One or more feeder cables feed off of the trunk/bridger station. Each feeder cable contains a number of taps disposed along the length of the feeder cable, and each tap contains a number of ports. A drop cable is connected between each port and a subscriber end. A television receiver is located at the subscriber end, and for a system offering two-way communications, the subscriber end will also have a terminal which transmits signals upstream, in the return path of the cable system.

Cable operating companies are now offering to their subscribers advanced communication services in the return path, including addressable converter operation, Pay Per View transactions, telephony, interactive digital networks, and computer data transmission. In order to offer such services in a reliable manner, certain problems in the return path must be addressed. For instance, many CATV cable systems are designed primarily for forward path operation. The loss (or attenuation) values of each tap are selected to provide proper signal levels at the drop cables, at forward path frequencies. The forward signal at each successive tap port is designed to have the same level at the highest design frequency. This insures a proper forward signal level to each subscriber.

Due to the forward tap design, the loss in the return path varies widely with every tap. This causes a corresponding variance in the signal levels in the return path. This variance in signal level imposes severe design constraints on subscriber terminal transmitters (e.g., set-top addressable converters), and adversely affects the ability of headend receivers to properly detect the return path signals. Significant improvements in the return path performance can be achieved by controlling the loss variance in the return path. If the loss at each tap port can be made substantially uniform, the total variance can be brought down to an acceptable level.

Another problem that must be addressed is interference (or "ingress") entering the return path at the subscriber end. Such interference is caused by radio frequency, electrical and electromagnetic sources, and enters the return path through damaged or insufficiently shielded subscriber drop cable, corroded "F" connectors, and internal subscriber wiring and hardware. As a result of the forward tap design, the taps contributing most to ingress are those having lower attenuation values (i.e., those taps at the distal end of the feeder cables).

An article by Dean A. Stoneback and William F. Beck, entitled "Designing the Return System for Full Digital Services", dated 1995, p. 269–71, (hereinafter "Stoneback" Article"), suggests that by reducing the loss variance in the return path (i.e., equalizing or balancing the return path), ingress can be reduced to a manageable level. Thus, the Stoneback Article suggests that by addressing the loss variance problem, the ingress problem can be satisfactorily resolved in most cases.

A practical and effective approach to balancing the return path loss must satisfy several requirements. First, the devices used to balance the loss must be inexpensive because of the large number of such devices needed to be distributed throughout the CATV cable system. Second, the devices must be small and light weight, because such devices need to be deployed on cables, tap ports, within the taps themselves, inside network interface devices, in on-premise enclosures, pedestals, ground blocks, etc. In many applications, the device should be housed in a small housing containing connectors at each end. Third, it is most desirable to leave unaffected the forward path response when employing the loss balancing devices. The loss chosen for the return path should be independent of the forward path response.

The Stoneback Article suggests two alternative methods of balancing the return path loss. The first is to employ a diplex filter with flat loss in the return band. The second method is to use an equalizer which covers the entire forward and return frequency bands. The diplex filter approach is discouraged by the Stoneback Article, because of the heretofore prevailing view that the device which adds flat loss in the return path is more difficult to manufacture.

Diplex filters have been used for processing both the forward and return paths in a CATV cable system. Examples of such use are disclosed in U.S. Pat. Nos. 5,434,610 to Loveless; 5,425,027 to Baran; 5,130,664 to Pavlic et al.; and 4,963,966 to Harney et al. The patents to Loveless and Pavlic show conventional circuit architectures for diplex filters employing flat loss. Such architectures employ a network of separately connected devices, each of which has a separate housing and associated connectors. Such assembled networks are more susceptible to interference pick-up than a singly packaged network. In addition, such architectures are too large and expensive for the CATV loss balancing application hereinabove described. Furthermore, as mentioned by the Stoneback Article, the flat loss device is more difficult to manufacture than an equalizer approach.

The use of equalization filters, as described in the Stoneback Article, also has drawbacks in the contemplated CATV loss balancing application. The forward path system architecture must be reconfigured, usually with an unfavorable reduction in system dynamic range performance. In addition, the loss chosen for the return path is not independent of the loss established in the forward path. Moreover, wideband (e.g., 5–750 MHz) equalization filters are more difficult to design and match than diplex filters. An example of a CATV system employing an equalizer is disclosed in U.S. Pat. No. 5,379,141 to Thompson et al.

OBJECTS AND SUMMARY OF THE INVENTION

It is therefore an object of the present invention to provide apparatus and methods that avoid the aforementioned problems associated with the prior art.

It is another object of the present invention to selectively control the loss at several points in at least one channel of a multi-channel communication system.

It is a further object of the present invention to equalize the return path signal loss for all subscribers in a multi-channel CATV system.

It is still another object of the present invention to reduce the interference (or "ingress") entering the return path of the CATV system without disturbing forward path performance.

It is still a further object of the present invention to provide a multi-band filter, for a CATV system, containing a predetermined amount of flat loss in the return path band.

It is yet another object of the present invention to provide a filter for controlling the return path loss in a multi-channel CATV system, which can be deployed on cables, tap ports, within the taps themselves, inside network interface devices, in on-premise enclosures, pedestals, ground blocks, etc.

It is yet a further object of the present invention to provide compensation for perturbations in the frequency response of the return path band of a multi-band filter.

These and other objects are attained in accordance with the present invention, wherein there is provided a passive filter for controlling the return path loss in a communication system having a forward path and return path. The filter comprises first and second terminals, a passive filter network, and a compensation circuit. The passive filter network is coupled to the first and second terminals and to ground. The filter network has a first passband which passes signals in the forward path and a second passband which passes signals in the return path. The filter network includes a passive attenuator network which attenuates signals in the return path by a predetermined amount as the signals pass through the second passband. The compensation circuit is coupled to the passive filter network, and is configured to compensate for expected perturbations in the frequency response of the second passband of the filter network.

BRIEF DESCRIPTION OF THE DRAWING

Further objects of the present invention will become apparent from the following description of the preferred embodiments with reference to the accompanying drawing, in which:

FIGS. 3A and 3B are simplified diagrams of a CATV cable system showing a comparison between unequalized (FIG. 3A) and equalized (FIG. 3B) loss in the return path, wherein equalization in FIG. 3B is achieved using filter apparatus of the present invention;

FIG. 4 is a side sectional view of the construction of the first embodiment of the present invention;

FIG. 5 is a cross sectional view of the filter construction of FIG. 4, taken along line 5—5 in FIG. 4;

DETAILED DESCRIPTION OF THE PREFERRED EMBODIMENTS

Figure 1:
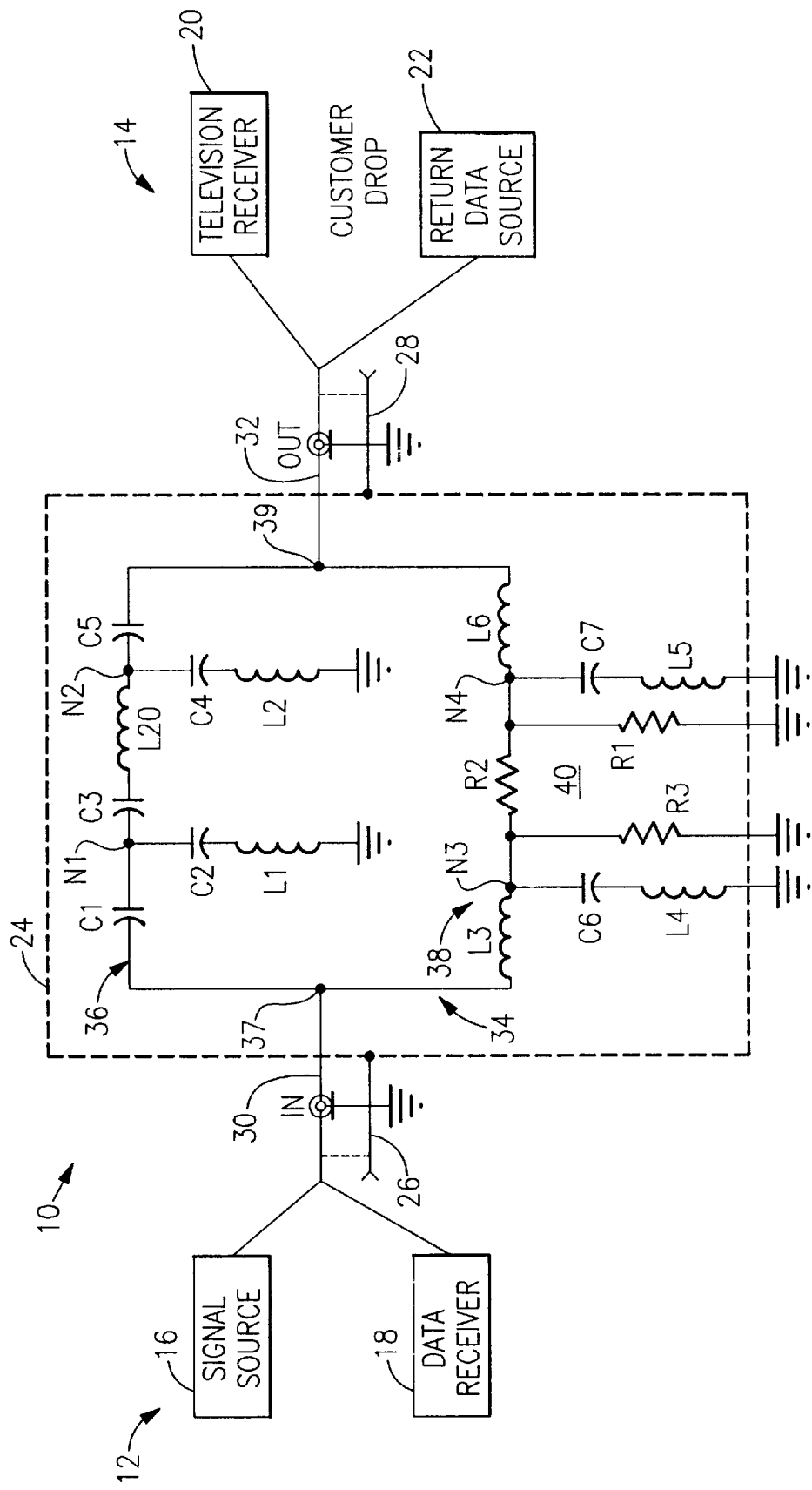
FIG. 1 is a schematic diagram of a first embodiment of the filter apparatus of the present invention, which includes a resistive "PI" attenuator network.

With reference to FIG. 1, there is shown a schematic diagram of a first embodiment of the present invention. A filter apparatus 10 is constructed in accordance with the present invention for controlling the return path loss in a multi-channel CATV cable system. The CATV system has a headend 12 and a number of subscriber ends 14. Headend 12 contains a headend transmitter 16 for transmitting RF television program signals in a forward path frequency band (e.g., 50–1000 MHz), and a headend receiver 18 for receiving signals from subscriber end 14 in a return path frequency band (e.g., 5–40 MHz). Signals from subscriber end 14 may include, for example, impulse Pay return signals, addressable converter signals, Pay Per View signals, and telephone voice/data signals. At subscriber end 14, a television receiver 20 is coupled to the CATV system for receiving the RF television program signals. A subscriber terminal 22 (e.g., a set-top addressable converter) is also coupled to the CATV system for transmitting and receiving signals in the return path frequency band.

In FIG. 1, filter apparatus 10 is shown containing a housing 24 which includes an input connector 26 and an output connector 28. An input terminal 30 extends into connector 26 and an output terminal 32 extends into connector 28. A passive filter network 34 is mounted inside housing 24, and is connected to input terminal 30, output terminal 32, and to ground. Network 34 includes a forward path filter network 36 and a return path filter network 38. Filter network 36 is coupled to input terminal 30 at a node 37 and to output terminal 32 at a node 39. Filter network 38 is also coupled to input terminal 30 at node 37 and to output terminal 32 at node 39.

Figure 10:
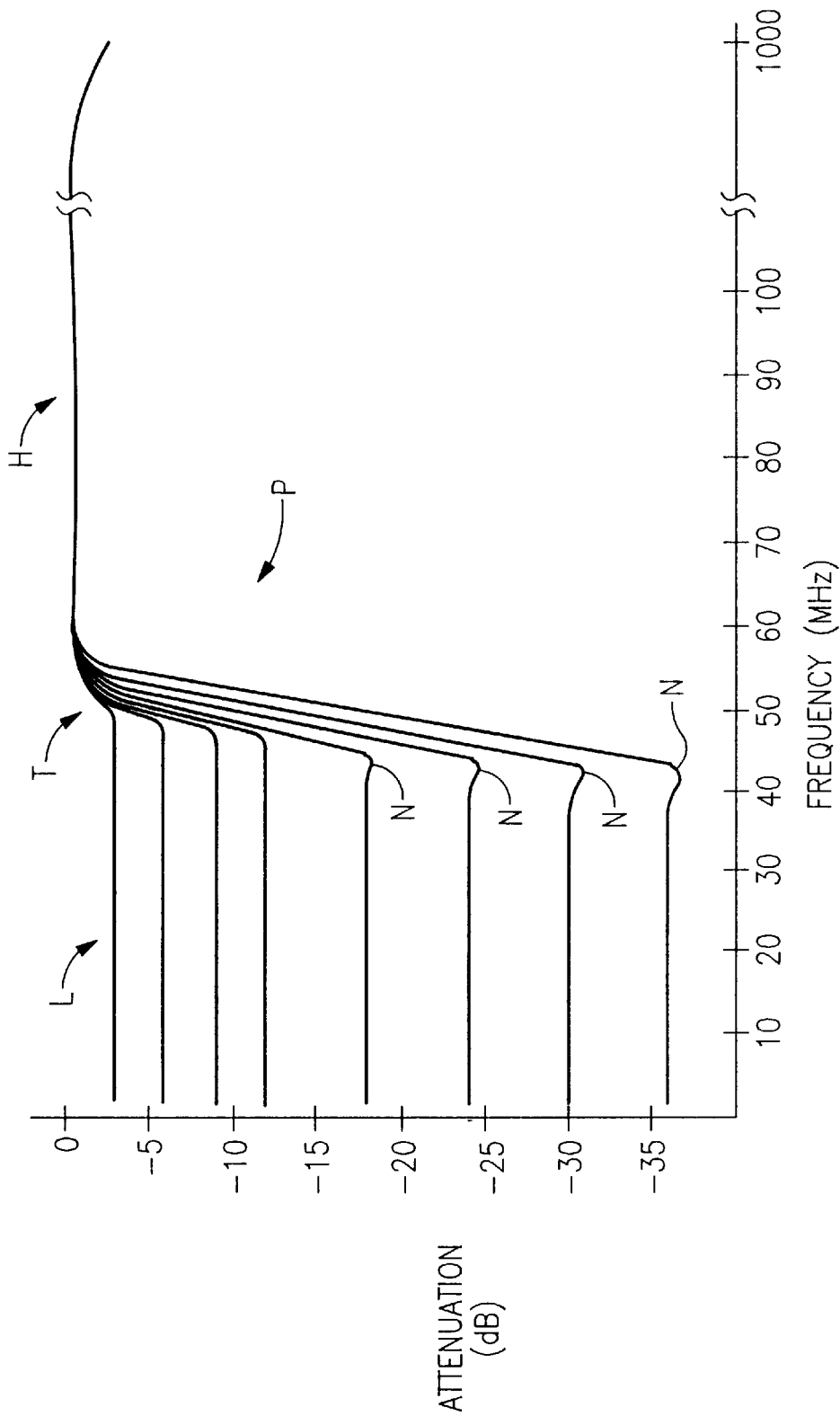
FIG. 10 is a diagram of frequency response plots of the first embodiment of the present invention, for different attenuation values ranging from 3 dB to 36 dB.

Forward path network 36 is essentially configured as a highpass, elliptic function, filter having a well-defined passband from about 50 MHz to about 1000 MHz (See FIG. 10).

This "highpass" passband allows RF television program signals to pass through filter apparatus 10 virtually unimpeded, in the forward path frequency band. The return path network 38 is essentially configured as a lowpass, elliptic function, filter with one very important distinction—a resistive attenuator network 40 has replaced a series inductor. Network 38 has a well-defined "lowpass" passband from about 1 MHz to about 41 MHz (See FIG. 10). As a result of attenuator network 40, the lowpass passband allows return path signals to pass through filter apparatus 10, attenuated by a predetermined (or stepped) amount of flat loss (i.e., frequency independent attenuation). Network 38 attenuates signals in the forward path frequency band, and such attenuation is both frequency dependent (i.e., the stopband response of network 38) and frequency independent (i.e., the flat loss contributed by attenuator network 40). Thus, the isolation between forward path and return path processing is improved (over a conventional diplex filter) by the attenuation contributed by network 40.

Filter network 34 is a tuned passive filter. As shown in FIG. 1, highpass network 36 includes: a series capacitor C1 coupled between input terminal 30 and a node N1; a tuned series capacitor/inductor branch C2/L1 connected between node N1 and ground; a series capacitor/inductor branch C3/L20 connected between node N1 and a node N2; another tuned series capacitor/inductor branch C4/L2 connected between node N2 and ground; and a series capacitor C5 coupled between node N2 and output terminal 32. L20 is included in network 36 to compensate for any stray capacitance produced by potting material used in the final assembly of filter apparatus 10.

As shown in FIG. 1, lowpass network 38 includes: a series inductor L3 coupled between input terminal 30 and a node N3; a tuned series capacitor/inductor branch C6/L4 connected between node N3 and ground; attenuator network 40, which is a 75 ohm matched attenuator configured as a two terminal "PI" network of resistors R1/R2/R3; another tuned series capacitor/inductor branch C7/L5 connected between a node N4 and ground; and a final series inductor L6 coupled between node N4 and terminal 32.

In operation, highpass network 36 actually has four poles contributing to its frequency response. Tuned branches C2/L1 and C4/L2 are resonant circuits establishing two poles at particular frequencies below the passband of highpass network 36 (e.g., 28 MHz and 35 MHz respectively). Capacitor C1 and inductor L3 combine in series with capacitor/inductor branch C6/L4, as a combined resonant circuit, to establish the third pole below the passband of network 36 (e.g., 38 MHz). Capacitor C5 and inductor L6 combine in series with capacitor/inductor branch C7/L5, as a combined resonant circuit, to establish the fourth pole below the passband of network 36 (e.g., 41 MHz). Lowpass network 38 has two poles contributing to its frequency response. Branches C6/L4 and C7/L5 are resonant circuits establishing two poles at particular frequencies above the passband of lowpass network 38 (e.g., 55 MHz and 60 MHz respectively).

The combined resonant circuits (i.e., C1/L3/C6/L4 and C5/L6/C7/L5) are realized in filter network 34 because of the presence of attenuator network 40 between circuits C6/L4 and C7/L5. If network 40 is replaced with an inductor between nodes 3 and 4, as in a diplex filter, the combined resonant circuits would not form, and the two additional poles would not be created (i.e., the frequency response of highpass network 36 would be defined by only two poles instead of four). The two additional poles in network 36 effects an unexpected and significant improvement in the overall frequency response of filter network 34. In comparison to a diplex filter of the same order, filter network 34 has a more defined (i.e., sharper) transition region between the highpass and lowpass regions. In addition, the transition region is more narrow (i.e., steeper) than in the diplex filter (e.g., by about 5 MHz) and, as a result, the band reject response of highpass network 36 is extended upward in frequency. Moreover, the attenuation in the band reject response of highpass network 36, near the transition region, is increased (e.g., by about 7 dB). Thus, filter network 34 achieves significantly improved frequency response performance without having to increase the order or complexity of the filter network. This is due to the sharing of components between highpass and lowpass networks 36 and 38. The number of filter components is maintained low while achieving improved performance.

The amount of flat loss introduced in the return path by attenuator network 40 can range from about 3 dB to about 36 dB (See FIG. 10). FIG. 10 shows a family of frequency response plots P of filter network 34, for several different values of flat loss introduced by network 40. Each plot includes a lowpass region L, a transition region T, and a highpass region H. The values of the LC components in network 34 remain the same over the 3 dB to 36 dB range of attenuation. As shown in FIG. 10, transition region T remains well behaved over the range of attenuation values.

In addition to an unexpected improvement in frequency response, the ratio of reflection loss to insertion loss in the return path of filter network 34 is unexpectedly high. The insertion loss is about 1 dB and the reflection loss is about 20 dB. A greater insertion loss for filter network 34 would have been expected.

Filter network 34 is based on an initial design for a set of complimentary lowpass/highpass 5th order elliptic function filters. Passband ripple and stopband attenuation were chosen at 0.04 and −27 dB respectively. After joining the filters for diplex operation, the mid-point lowpass series inductance was removed and replaced by attenuator network 40. A circuit optimization program (e.g., the EESOF Touchstones® program) was used to modify element values in a manner that would permit a single set of reactive components to accommodate a range of 0–30 dB in return path loss, while maintaining a −20 dB reflection loss across the entire RF spectrum.

Figure 2:
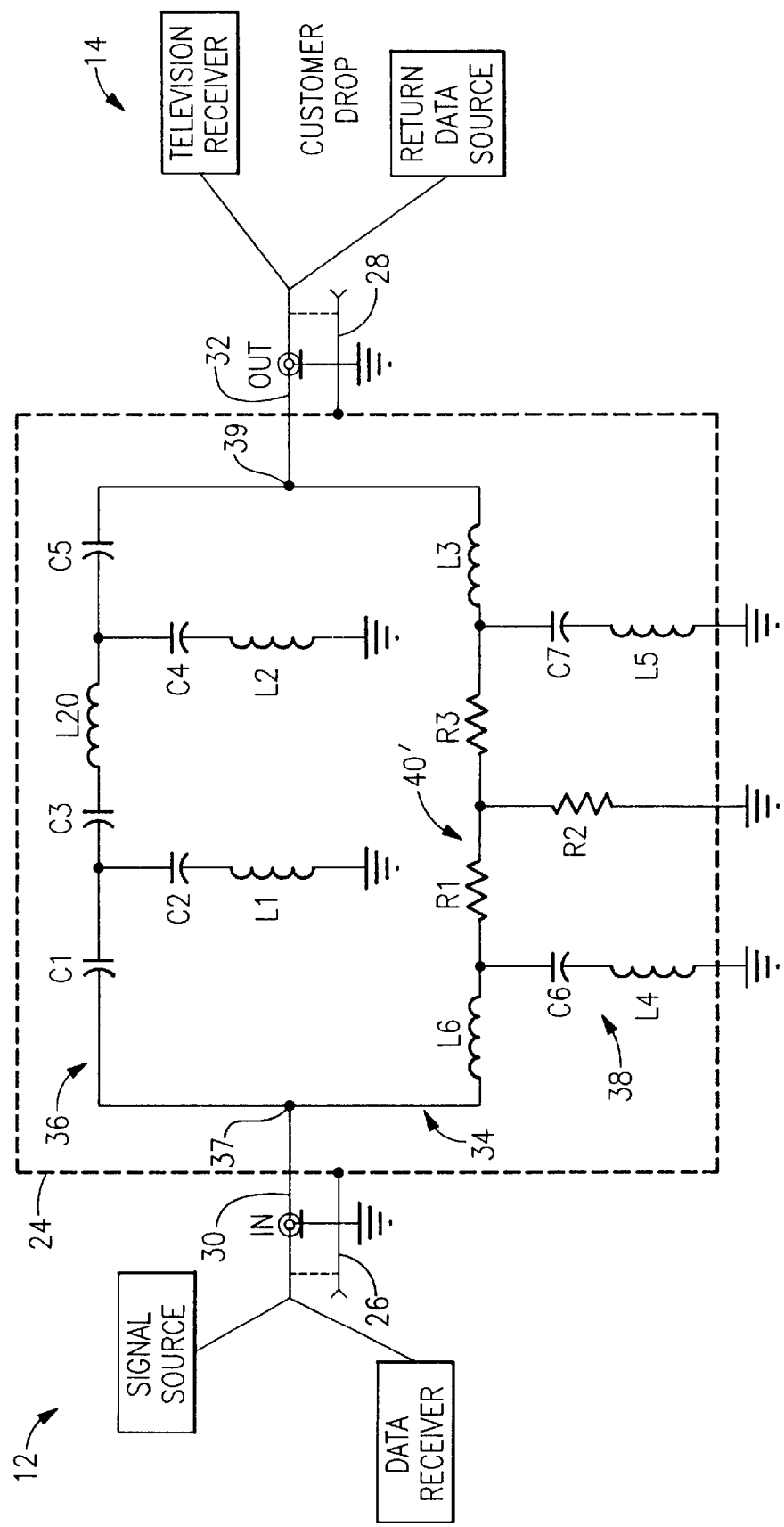
FIG. 2 is a schematic diagram of a second embodiment of the filter apparatus of the present invention, which includes a resistive "TEE" attenuator network.

Referring now to FIG. 2, there is shown a schematic diagram of the second embodiment of filter apparatus 10. This embodiment is identical to the first embodiment except that attenuator network 40 (a resistive "PI" network) is replaced with an attenuator network 40', arranged as a resistive "TEE" network (R1,R2,R3).

FIGS. 3A and 3B illustrate how filter 10 can be used to control the return path loss in a CATV cable system. As shown in FIGS. 3A and 3B, a cable system branch 100 includes an amplifier station 102 connected between the headend of the CATV system and a feeder cable 104. Feeder 104 includes a number of taps 106, and each of the taps includes four tap ports. A drop cable 108 is connected between a tap port of each tap 106 and a subscriber location. At each subscriber location, there is a television receiver (not shown) and a subscriber terminal transmitter 110, both coupled to drop cable 108. In this example, transmitters 110 transmit subscriber signals in the return path, at a gain level of +50 dBmV. The attenuation (in dB) introduced by each tap 106 is noted adjacent to the tap. The variation of attenuation values in taps 106 are due to the forward path design of feeder cable 104 (See Background of the Invention, above).

In FIG. 3A, as subscriber signals are transmitted upstream from transmitter 110, the 50 dB signal level is attenuated by tap 106, resulting in a return level in feeder 104. The return level is noted at each tap in FIG. 3A. In the example of FIG. 3A, the maximum variation in return levels of the subscriber signals is 27 dB, which imposes severe constraints on the CATV system (See discussion above in Background of the Invention).

In FIG. 3B, a filter 112, corresponding to apparatus 10, has been installed at each active tap port. Filter 112 introduces a specified amount of attenuation in the return path while leaving the forward path unchanged. The amount of attenuation (in dB) is noted on each filter 112 in FIG. 3B. The attenuation introduced by filters 112 substantially balances or equalizes the return level variation. The return levels are noted adjacent to each tap 106 in FIG. 3B. In this example, the maximum variation in return levels is only 7 dB, which is small enough to avoid the problems normally associated with an unequalized return path. In addition to equalization, filters 112 also reduce ingress entering at the drop cables and subscriber locations.

The general construction of one embodiment of filter apparatus 10 will now be described with reference to FIGS. 4–6. FIG. 4 is a side view of filter apparatus 10, showing housing 24 in section and filter network 34 intact. The construction of housing 24 is well known in the CATV filter industry. Connector 26 and connector (or "filter cap") 28 form part of housing 24. A printed circuit board 150 is mounted, in the usual manner, in housing 24. Filter network 34 is assembled on circuit board 150. Housing 24 may also include a pair of o-rings 152 seated in a pair of circumferential grooves 154, respectively, around housing 24. A sleeve (not shown) may be slipped over housing 24 and made to engage o-rings 152 to effect a seal around housing 24. As indicated in FIGS. 4–6, the shape of housing 24 is cylindrical.

It is important that filter apparatus 10 be made as small and light as possible to accommodate the variety of installation options (e.g., at the tap port, inside the tap, inside a network interface device, in on-premise enclosures, pedestals, ground blocks, etc.). For CATV system applications, the housing should have an interior volume of less than about 5 cubic inches. Preferably, the cylindrical housing shown in FIGS. 4–6 should have a length not exceeding about 80 mm and a diameter not exceeding about 25 mm. FIG. 6 shows the typical component layout of network 34 on circuit board 150.

Figure 6:
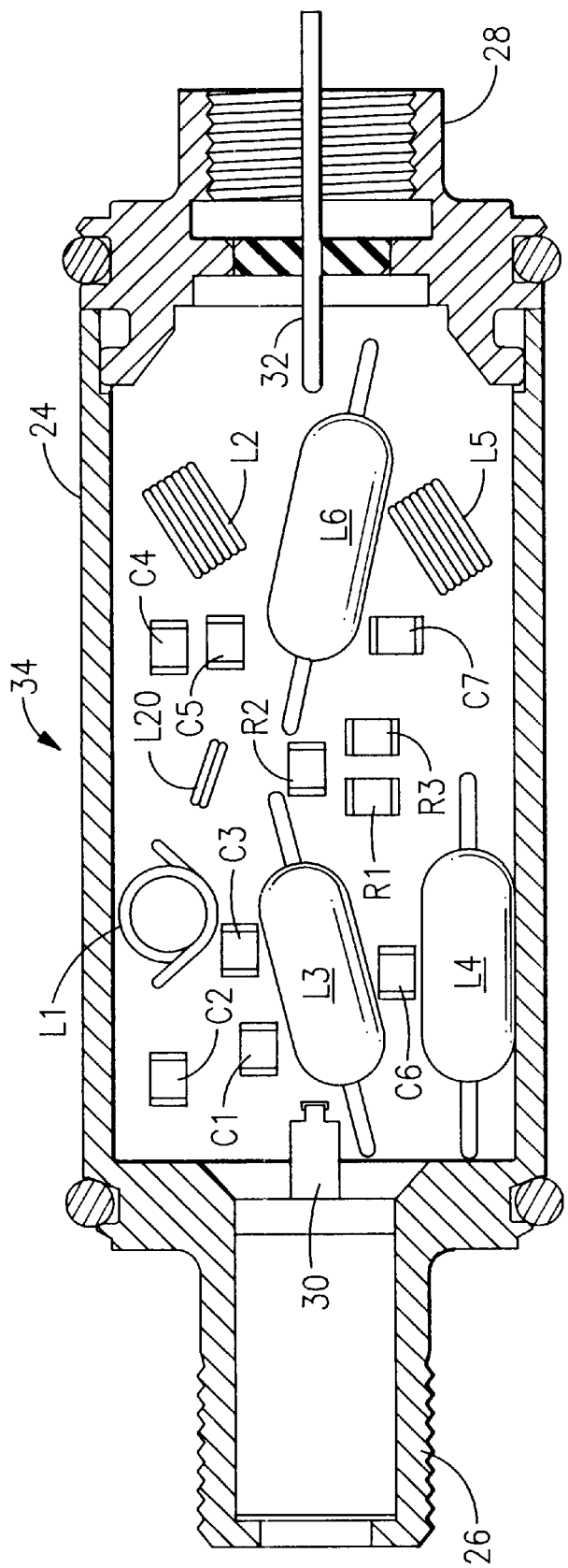
FIG. 6 is a top sectional view of the filter construction of FIG. 4, showing the printed circuit board component layout.

For many CATV system applications, filter apparatus 10 may be packaged in a housing like housing 24 shown in FIGS. 4–6. Housing 24 is preferably made of metal. However, for some applications, the housing may be made of plastic and take on any shape suitable for the application. For example, if filter apparatus 10 is to be installed at the tap port, the preferred housing should be made of metal and configured like housing 24. If filter apparatus 10 is to be installed inside the tap, the housing may be made of plastic and be rectangular in shape.

Figure 7:
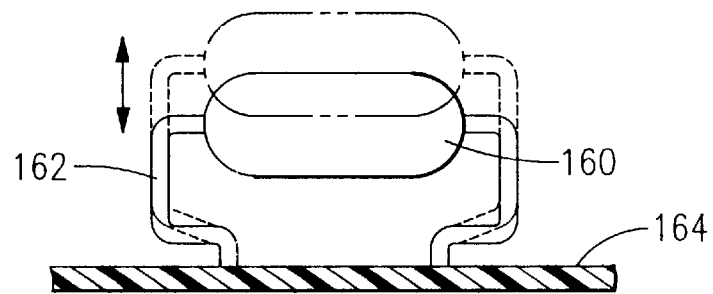
FIGS. 7–9 are a series of diagrammatic sketches illustrating a method of positional tuning of ferrite core inductors.

In the preferred embodiment of filter apparatus 10, for CATV cable system applications, all filter components (e.g., inductors and capacitors) are non-tunable (i.e., fixed-value) components. In addition, some of the inductors used in the filter networks are ferrite core inductors. For instance, in filter apparatus 10, inductors L3, L4 and L6 are Ferrite DR Core inductors with leads pre-formed as best shown in FIGS. 4 and 7. Fixed-value components and ferrite core inductors are chosen for apparatus 10 because these types of components are generally smaller and cheaper than their tunable counterparts. However, the use of fixed-value components and ferrite core inductors can make the manufacture of filters difficult. It is an object of the present invention to overcome these difficulties by employing a novel method of positional tuning of the ferrite core inductors.

The positional tuning method of the present invention is based on the principle that ferrite core inductors are very sensitive to inductive coupling. The position of a ferrite core inductor relative to another inductor (ferrite core or other type), or to a metal housing containing the inductor, will significantly alter the effective inductance of that ferrite inductor in the circuit in which it operates. It has been found that the effective inductances of ferrite core inductors in a network such as network 34, are consistently less than the inductances specified for those inductors. As a result of these properties, a method has been devised to effectively tune a ferrite core inductor in the circuit, by adjusting the position of the inductor.

Figure 8:
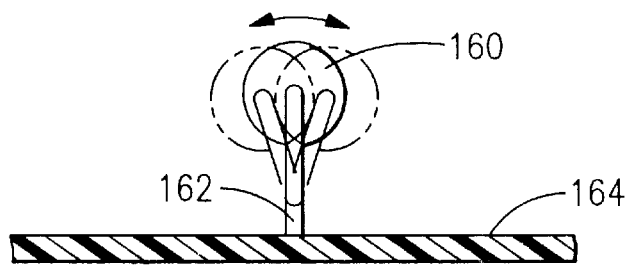
Figure 9:
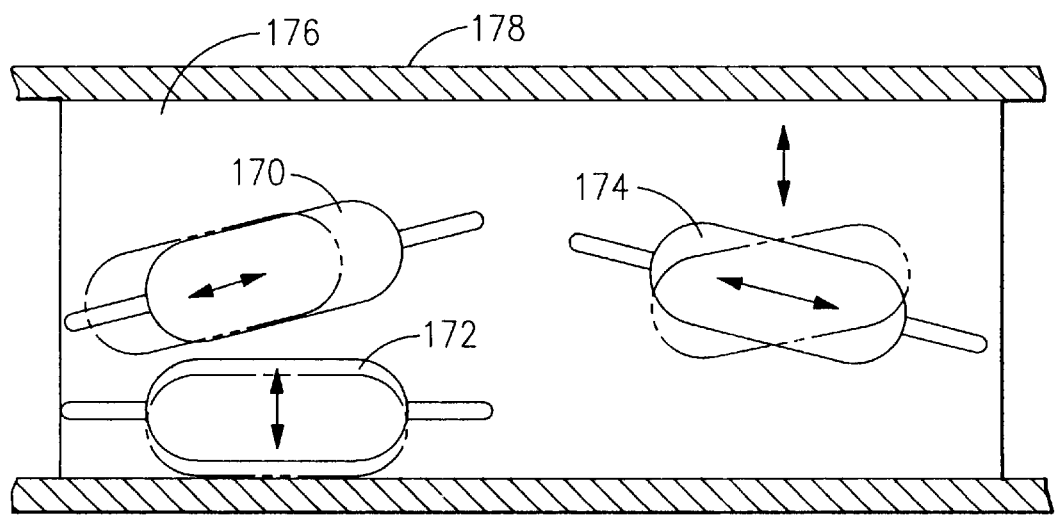

FIGS. 7–9 illustrate different ways in which a ferrite core inductor can be adjusted. As shown in FIG. 7, a ferrite core inductor 160, having preformed leads 162, is mounted on a circuit board 164. The position of inductor 160 is adjusted upward (or downward). In FIG. 8, the position of inductor 160 is pivoted sideways, in either direction, about leads 162. In FIG. 9, ferrite core inductors 170, 172 and 174 are mounted on a circuit board 176 which is, in turn, mounted in a housing 178. Inductor 170 is tuned, for example, by adjusting its position forwards and backwards. Inductor 172 is tuned, for example, by adjusting its position towards and away from housing 178. Inductor 174 is tuned, for example, by adjusting its position torsionally.

A method of tuning network 34 (FIG. 6) by positional tuning, for example, ferrite inductor L3, will now be described. First, the correct inductance value for inductor L3, in network 34, is calculated or otherwise determined (e.g., iterative computer program). Second, a ferrite core inductor is selected for L3, having a specified inductance greater than the value determined in the first step. The specified value should be about 10–15% greater than the determined value. Then, the selected inductor is mounted in network 34 as L3, and its position is adjusted until its effective inductance is substantially equal to the determined inductance value for L3.

Further cost reductions for apparatus 10, can be achieved if standard capacitor values are used. Such capacitors are readily available and cheap. A method of making filter network 34 using standard capacitor values will now be described. First, standard capacitance values for the capacitors in network 34 are selected. Second, the inductance values for the inductors in network 34 are calculated or otherwise determined. Third, ferrite core inductors are selected for L3, L4 and L6, having specified inductances about 10–15% greater than the values determined for L3, L4 and L6, in the second step. Fourth, the selected ferrite core inductors (and the other inductors for network 34) are then mounted on circuit board 150, in network 34. Fifth, the positions of the ferrite core inductors are adjusted until their effective inductances are substantially equal to the determined inductance values for L3, L4 and L6.

Once network 34 is complete, the mechanical assembly of filter 10 is performed, including the injection of potting material into the housing to hold the circuit components in place and protect them from mechanical shock and the environment.

Figure 11:
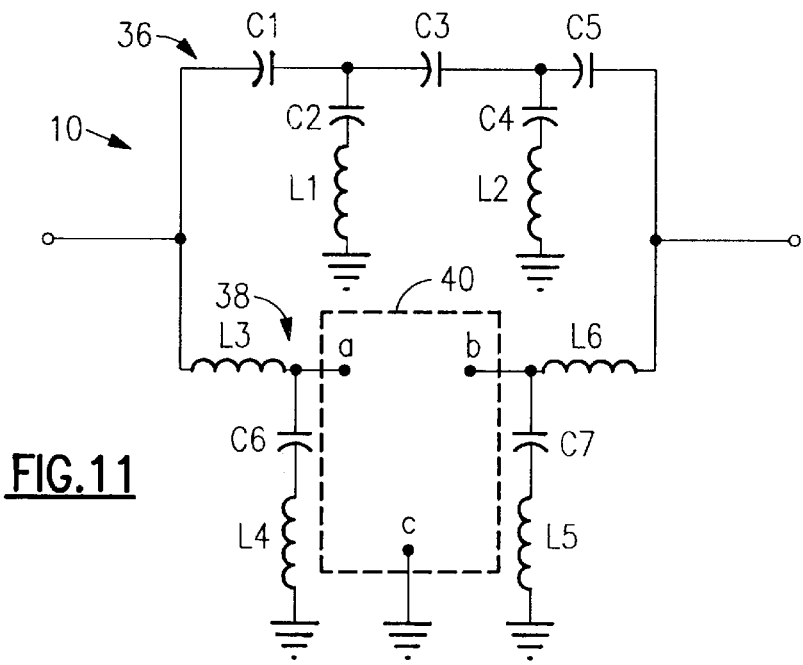
FIG. 11 is a generalized schematic diagram of a third embodiment of the present invention, into which different attenuator/compensation circuits may be incorporated.

Referring now to FIG. 11, there is shown a schematic diagram of a third embodiment of the present invention. This embodiment is identical to the first and second embodiments (FIGS. 1 and 2), except for attenuator network 40 and the absence of inductor L20. In FIG. 11, the third embodiment is shown without a filter housing. Of course, this embodiment could be implemented in a housing as shown in FIGS. 1–2 and 4–6. The present invention is not limited to any particular mechanical construction or implementation. For example, the first, second and third embodiments may be simply implemented on a circuit board inside a CATV multi-tap.

As mentioned above, it is desirable to make filter apparatus 10 as small as possible, and with the least amount of circuit components. This goal has been achieved in the first and second embodiments described above while maintaining very good frequency response characteristics (i.e., well defined forward and return path bands with a relatively sharp transition region). However, in very compact implementations, a small perturbation may be experienced in the frequency response of filter apparatus 10. As shown in FIG. 10, this perturbation appears as a dip or shallow null "N" at the end of the return path band, near the transition region.

Figure 12:
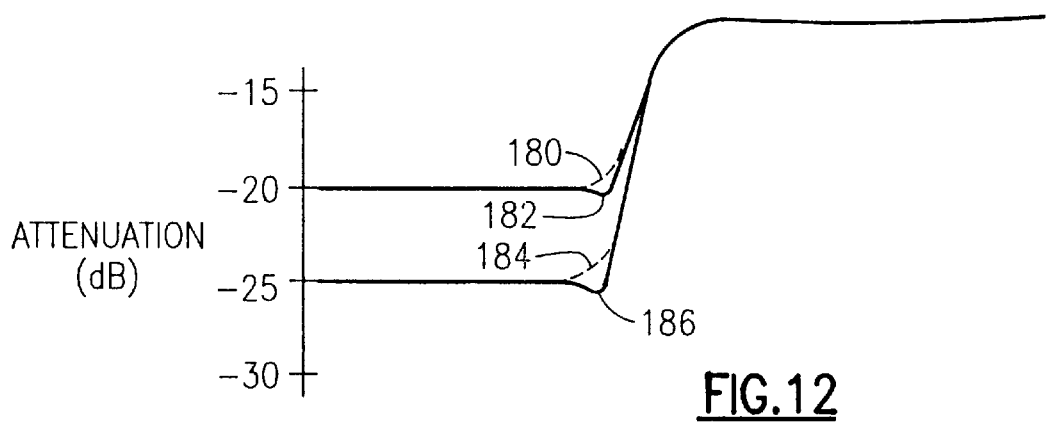
FIG. 12 is a pair of frequency response plots of the first embodiment of the present invention, comparing computed performance with actual performance and showing frequency response perturbations in the actual performance plots.

In FIG. 12, a series of frequency response plots (attenuation vs. frequency) illustrate a comparison between computed and actual performance of filter apparatus 10. A computed response 180 is compared to an actual response 182, at an attenuation value of 20 dB. A computed response 184 is compared to an actual response 186, at an attenuation value of 25 dB. These comparisons illustrate the frequency response perturbation occurring at the end of the return path band (near the transition region). It is believed that this perturbation is due to the effects of mutual coupling between components in a very compact circuit design.

Figure 11A:
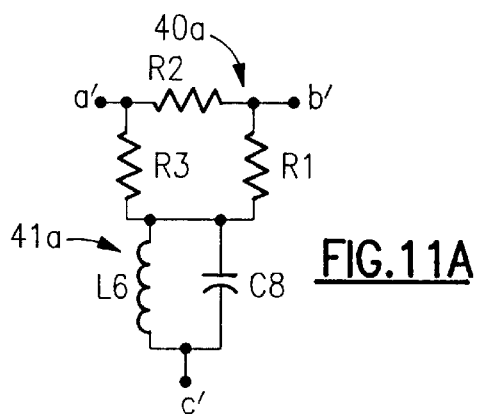
FIGS. 11A–11D is a series of schematic diagrams showing alternative attenuator/compensation circuits which may be incorporated into the schematic diagram of FIG. 11.
Figure 11B:
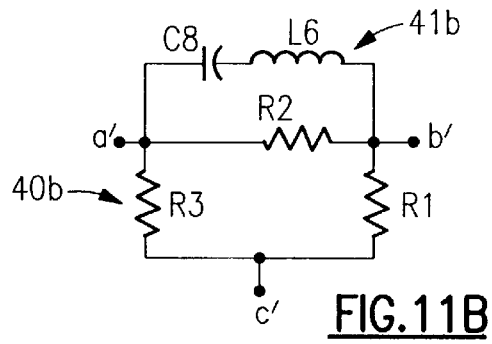
Figure 11C:
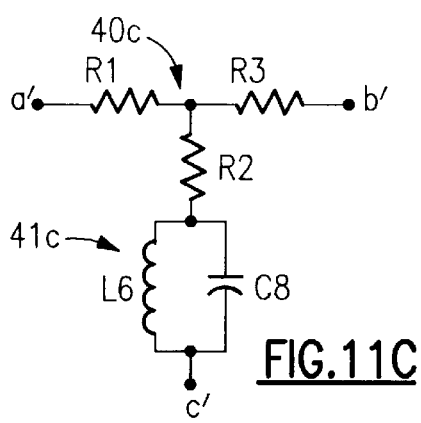
Figure 11D:
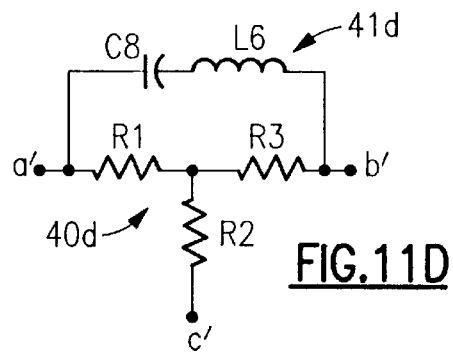

Correction of this perturbation is provided for in the third embodiment of the present invention (FIGS. 11–11D). FIG. 11 shows a schematic for filter apparatus 10 which has been generalized for attenuator network 40. FIGS. 11A–11D are schematics of alternative attenuator networks, 40a, 40b, 40c, and 40d, respectively. Each of these networks can be inserted into the generalized schematic of FIG. 11. Note that attenuator networks 40a, 40b, 40c, and 40d each include a resonant circuit coupled thereto. These resonant circuits function to compensate for the frequency response perturbation described above.

As shown in FIG. 11A, attenuator network 40a is a resistive "PI" network R1/R2/R3. A parallel resonant circuit 41a, comprising an inductor L6 in parallel with a capacitor C8, is coupled between resistive network R1/R2/R3 and ground.

As shown in FIG. 11B, attenuator network 40b is a resistive "PI" network R1/R2/R3. A series resonant circuit 41b, comprising inductor L6 in series with capacitor C8, is coupled across resistive network R1/R2/R3.

As shown in FIG. 11C, attenuator network 40c is a resistive "TEE" network R1/R2/R3. A parallel resonant circuit 41c, comprising inductor L6 in parallel with capacitor C8, is coupled between resistive network R1/R2/R3 and ground.

As shown in FIG. 11D, attenuator network 40d is a resistive "TEE" network R1/R2/R3. A series resonant circuit 41d, comprising inductor L6 in series with capacitor C8, is coupled across resistive network R1/R2/R3.

The networks of FIGS. 11A–11D each contain terminals a', b' and c', which correspond to terminals a, b and c in FIG. 11. Each of the networks in FIGS. 11A–11D can be connected in the circuit of FIG. 11, at location 40, such that terminals a', b' and c' are matched with terminals a, b and c, respectively. Thus, it is seen from FIG. 11 that return path filter network 38 includes a resistive attenuator network and a compensation network.

Figure 13:
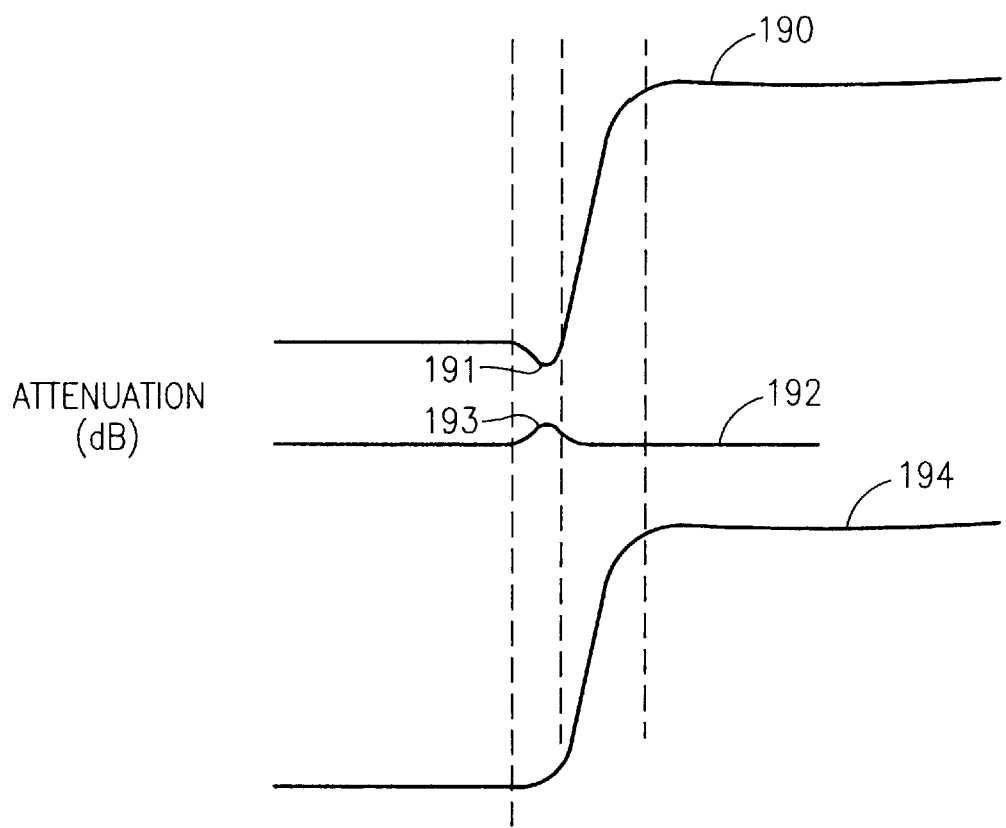
FIG. 13 is a set of frequency response plots showing an uncompensated filter response, a compensating attenuator response, and a compensated filter response.

FIG. 13 illustrates how compensation circuits 41a–41d correct for the above-described frequency response perturbation. FIG. 13 shows a set of frequency response plots (attenuation vs. frequency). Plot 190 represents the uncompensated response of filter 10, containing a perturbation 191; plot 192 represents a combined response of attenuator network 40 and compensation network 41, which includes a compensation characteristic 193; and plot 194 represents the resulting, compensated response for filter 10, where the perturbation has been eliminated.

It is to be understood that the attenuator and compensation networks of the present invention are not limited to those shown in FIGS. 11A–11D. Any suitable attenuator or compensation network is considered to be within the scope of the present invention. For example, other resonant circuits may be used in place of or in combination with the circuits shown in FIGS. 11A–11D. Resonant circuits, such as parallel and series RLC (resistor, inductor and capacitor) circuits may be employed. In an other example, the series resonant circuit 41b can be added to the circuit of FIG. 11A, such that two resonant circuits (41a and 41b) provide the compensation. It is preferred, however, that a single resonant circuit be used because of the desire to maintain a compact, low cost design. It has been learned that a single resonant circuit is all that is necessary to provide adequate compensation.

It should be noted that each or any of the capacitors in the circuits of FIGS. 1, 2 and 11 may be replaced with two parallel capacitors of standard values, in order to achieve capacitance values which are not standard off-the-shelf values. While such an approach provides added design flexibility, it increases the cost and size of the filter. Such an approach is not optimum for applications calling for very small and inexpensive filters.

While the preferred embodiments of the invention have been particularly described in the specification and illustrated in the drawing, it should be understood that the invention is not so limited. Many modifications, equivalents, and adaptations of the invention will become apparent to those skilled in the art without departing from the spirit and scope of the invention as defined in the appended claims.

What is claimed is:

1. A passive filter for controlling the return path loss in a communication system having a forward path and a return path, said filter comprising:

a first terminal and a second terminal;

a first passive filter network, coupled to said first and said second terminals and to ground, said first filter network having a passband which passes signals in the forward path of the communication system and a stop band which attenuates signals in the return path of the communication system;

a second passive filter network, coupled to said first and said second terminals and to ground, said second filter network having a passband which passes signals in the return path of the communication system and a stop band which attenuates signals in the forward path of the communication system, the passband of said second filter network containing a frequency response perturbation, said second filter network including a passive attenuator network which attenuates signals in the passband of said second filter network by a predetermined amount; and compensation circuit means, coupled to said second filter network, for compensating for the perturbation in the passband of said second filter network.

2. The filter of claim 1, wherein the communication system is a cable television system having a headend and a subscriber end, the signals in the forward path being RF television program signals transmitted from the headend, and the signals in the return path being signals transmitted from the subscriber end.

3. The filter of claim 1, wherein said first passive filter network is a highpass filter.

4. The filter of claim 1, wherein said second passive filter network is a lowpass filter.

5. The filzer of claim 1, wherein the passive attenuator network includes a resistive "T" network.

6. The filter of claim 1, wherein the passive attenuator network includes a resistive "PI" network.

7. The filter of claim 1, wherein said compensation circuit means is a resonant circuit coupled to the passive attenuator network.

8. The filter of claim 7, wherein the passive attenuator network includes a resistive network, said resonant circuit being coupled between said resistive network and ground.

9. The filter of claim 7, wherein the passive attenuator network includes a resistive network, said resonant circuit being coupled across said resistive network.

10. The filter of claim 1, wherein the predetermined amount of attenuation of the passive attenuator network is in the range of from about 1 dB to about 40 dB.

11. A cable television system having a headend, a subscriber end, and a tap coupled between the headend and the subscriber end, said system further comprising the filter of claim 1, wherein said filter is coupled to said tap, and the signals in the forward path are RF television program signals transmitted from the headend, and the signals in the return path are signals transmitted from the subscriber end.

12. A passive filter for controlling the return path loss in a communication system having a forward path and a return path, said filter comprising:

a first terminal and a second terminal;

a passive filter network, coupled to said first and said second terminals and to ground, said filter network having a first passband which passes signals in the forward path and a second passband which passes signals in the return path, the second passband containing a frequency response perturbation, said filter network including a passive attenuator network which attenuates signals in the return path by a predetermined amount as the signals pass through the second passband; and compensation circuit means, coupled to said passive filter network, for compensating for the perturbation in the second passband of said passive filter network.

13. The filter of claim 12, wherein the communication system is a cable television system having a headend and a subscriber end, the signals in the forward path being RF television program signals transmitted from the headend, and the signals in the return path being signals transmitted from the subscriber end.

14. The filter of claim 12, wherein said passive filter network is a diplex filter.

15. The filter of claim 12, wherein said compensation circuit means is a resonant circuit coupled to the passive attenuator network.

16. The filter of claim 15, wherein the passive attenuator network includes a resistive network, said resonant circuit being coupled between said resistive network and ground.

17. The filter of claim 15, wherein the passive attenuator network includes a resistive network, said resonant circuit being coupled across said resistive network.

18. The filter of claim 12, wherein the predetermined amount of attenuation of the passive attenuator network is in the range of from about 1 dB to about 40 dB.

19. A cable television system having a headend, a subscriber end, and a tap coupled between the headend and the subscriber end, said system further comprising the filter of claim 12, wherein said filter is coupled to said tap, and the signals in the forward path are RF television program signals transmitted from the headend, and the signals in the return path are signals transmitted from the subscriber end.

20. A method of controlling the return path loss in a communication system having a forward path and a return path, said method comprising the steps of:

(a) passing signals in the forward path of the communication system through a forward path passband;

(b) passing signals in the return path of the communication system through a return path passband, the return path passband containing a frequency response perturbation;

(c) attenuating the return path passband by a predetermined amount such that the signals passing therethrough are attenuated by said amount; and (d) compensating for the perturbation in the return path passband.

* * * * *